(12) United States Patent
Noquil et al.

(10) Patent No.: US 11,043,477 B2
(45) Date of Patent: Jun. 22, 2021

(54) POWER CONVERTER MONOLITHICALLY INTEGRATING TRANSISTORS, CARRIER, AND COMPONENTS

(71) Applicant: TEXAS INSTRUMENTS INCORPORATED, Dallas, TX (US)

(72) Inventors: Jonathan Almeria Noquil, Bethlehem, PA (US); Osvaldo Jorge Lopez, Annandale, NJ (US); Haian Lin, Bethlehem, PA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/027,031

(22) Filed: Jul. 3, 2018

(65) Prior Publication Data
US 2018/0331083 A1   Nov. 15, 2018

Related U.S. Application Data

(62) Division of application No. 15/019,275, filed on Feb. 9, 2016, now Pat. No. 10,050,025.

(51) Int. Cl.
*H01L 23/24* (2006.01)
*H01L 25/16* (2006.01)
(Continued)

(52) U.S. Cl.
CPC .............. *H01L 25/16* (2013.01); *H01L 21/56* (2013.01); *H01L 23/3107* (2013.01);
(Continued)

(58) Field of Classification Search
CPC ......... H01L 25/16; H01L 21/56; H01L 24/92; H01L 24/85; H01L 23/3107; H01L 24/49; H01L 24/09; H01L 23/49838; H01L 23/3121; H01L 24/32; H01L 24/16; H01L 24/13; H01L 21/76898; H01L 24/48; H01L 24/73; H01L 23/481; H01L 2924/07802; H01L 2924/1306; H01L 2924/00014;
(Continued)

(56) References Cited

U.S. PATENT DOCUMENTS 3,544,863 A * 12/1970 Price .................... H01L 27/0229
257/532
5,191,405 A * 3/1993 Tomita .................. H01L 23/481
257/763
(Continued)

*Primary Examiner* — Mary A Wilczewski
*Assistant Examiner* — Tsz K Chiu
(74) *Attorney, Agent, or Firm* — Rose Alyssa Keagy; Charles A. Brill; Frank D. Cimino

(57) ABSTRACT

A power converter (100) comprising a semiconductor chip (101) with a first (101*a*) and a parallel second (101*b*) surface, and through-silicon vias (TSVs, 110). The chip embedding a high-side (HS) field-effect transistor (FET) interconnected with a low side (LS) FET. Surface (101*a*) includes first metallic pads (111) as inlets of the TSVs, and an attachment site for an integrated circuit (IC) chip (150). Surface (101*b*) includes second metallic pads (115) as outlets of the TSVs, and third metallic pads as terminals of the converter: Pad (123*a*) as HS FET inlet, pad (122*a*) as HS FET gate, pad (131*a*) as LS FET outlet, pad (132*a*) as LS FET gate, and gate (140*a*) as common HS FET and LS FET switch-node. Driver-and-controller IC chip 150) has the IC terminals connected to respective first pads.

16 Claims, 5 Drawing Sheets

(51) Int. Cl.
  *H01L 23/00* (2006.01)
  *H01L 23/31* (2006.01)
  *H01L 23/498* (2006.01)
  *H01L 21/56* (2006.01)
  *H02M 3/155* (2006.01)
  *H01L 23/48* (2006.01)
  *H01L 21/768* (2006.01)
  *H02M 3/158* (2006.01)

(52) U.S. Cl.
  CPC ........ *H01L 23/49838* (2013.01); *H01L 24/09* (2013.01); *H01L 24/49* (2013.01); *H01L 24/85* (2013.01); *H01L 24/92* (2013.01); *H02M 3/155* (2013.01); *H01L 21/76898* (2013.01); *H01L 23/3121* (2013.01); *H01L 23/481* (2013.01); *H01L 24/13* (2013.01); *H01L 24/16* (2013.01); *H01L 24/32* (2013.01); *H01L 24/48* (2013.01); *H01L 24/73* (2013.01); *H01L 2224/02372* (2013.01); *H01L 2224/0401* (2013.01); *H01L 2224/04042* (2013.01); *H01L 2224/08225* (2013.01); *H01L 2224/131* (2013.01); *H01L 2224/16145* (2013.01); *H01L 2224/16225* (2013.01); *H01L 2224/32145* (2013.01); *H01L 2224/48145* (2013.01); *H01L 2224/48227* (2013.01); *H01L 2224/48465* (2013.01); *H01L 2224/73251* (2013.01); *H01L 2224/73265* (2013.01); *H01L 2224/80001* (2013.01); *H01L 2224/9222* (2013.01); *H01L 2225/06506* (2013.01); *H01L 2225/06513* (2013.01); *H01L 2225/06541* (2013.01); *H01L 2225/06568* (2013.01); *H01L 2924/00014* (2013.01); *H01L 2924/1306* (2013.01); *H01L 2924/13091* (2013.01); *H01L 2924/1425* (2013.01); *H01L 2924/19015* (2013.01); *H01L 2924/19041* (2013.01); *H01L 2924/19042* (2013.01); *H01L 2924/19104* (2013.01); *H01L 2924/19105* (2013.01); *H02M 3/158* (2013.01)

(58) Field of Classification Search
  CPC . H01L 2224/48247; H01L 2224/40095; H01L 2224/40245; H01L 2224/73221; H01L 2224/40091; H01L 2224/49109; H01L 2224/05554; H01L 2224/84801; H01L 2224/83801; H01L 2224/06181; H01L 2224/0603; H01L 24/40; H01L 24/36; H01L 24/41; H01L 27/0688; H01L 24/84; H01L 23/49575; H01L 23/49562; H01L 23/49524; H01L 23/49548; H02M 7/003
  See application file for complete search history.

(56) References Cited

U.S. PATENT DOCUMENTS

| | | | | |
|---|---|---|---|---|
| 7,295,453 B2* | | 11/2007 | Shiraishi | H02M 7/003 363/144 |
| 7,687,902 B2* | | 3/2010 | Shiraishi | H01L 24/49 257/723 |
| 8,040,708 B2* | | 10/2011 | Sato | H01L 24/73 363/147 |
| 8,115,260 B2* | | 2/2012 | Kinzer | H01L 21/76898 257/401 |
| 8,304,888 B2* | | 11/2012 | England | H01L 23/3677 257/692 |
| 8,633,550 B2* | | 1/2014 | Uno | H01L 24/37 257/401 |
| 8,679,896 B2* | | 3/2014 | Joshi | H01L 24/41 438/113 |
| 9,418,986 B2* | | 8/2016 | Uno | H01L 23/49575 |
| 9,437,673 B2* | | 9/2016 | Mallikarjunaswamy | H01L 27/088 |
| 9,831,159 B2* | | 11/2017 | Cho | H01L 23/49562 |
| 9,842,797 B2 | | 12/2017 | Carpenter et al. | |
| 10,050,530 B2* | | 8/2018 | Babazadeh | H02M 3/158 |
| 10,181,847 B2* | | 1/2019 | Bondade | H03K 5/2481 |
| 10,438,936 B2* | | 10/2019 | Lopez | H01L 23/06 |
| 10,573,585 B2* | | 2/2020 | Joshi | H01L 25/16 |
| 10,644,601 B2* | | 5/2020 | Pao | H02M 3/158 |
| 10,784,213 B2* | | 9/2020 | Gao | H01L 25/18 |
| 10,818,646 B2* | | 10/2020 | Palm | H05K 1/09 |
| 2005/0156204 A1 | | 7/2005 | Uno et al. | |
| 2005/0179472 A1 | | 8/2005 | Nakamura et al. | |
| 2006/0113664 A1 | | 6/2006 | Shiraishi et al. | |
| 2007/0249092 A1 | | 10/2007 | Joshi et al. | |
| 2007/0278516 A1 | | 12/2007 | Hashimoto et al. | |
| 2009/0174046 A1* | | 7/2009 | Liu | H01L 24/49 257/676 |
| 2009/0230537 A1* | | 9/2009 | Liu | H01L 21/563 257/690 |
| 2009/0278241 A1* | | 11/2009 | Liu | H01L 23/49861 257/676 |
| 2010/0059875 A1 | | 3/2010 | Sata et al. | |
| 2010/0090668 A1 | | 4/2010 | Girdhar et al. | |
| 2010/0123257 A1* | | 5/2010 | Liu | H01L 25/0657 257/777 |
| 2010/0155915 A1 | | 6/2010 | Bell et al. | |
| 2011/0079917 A1* | | 4/2011 | Xia | H01L 21/76898 257/774 |
| 2011/0121808 A1* | | 5/2011 | Girdhar | H01L 27/088 323/311 |
| 2011/0163391 A1* | | 7/2011 | Kinzer | H01L 21/76898 257/401 |
| 2012/0181629 A1* | | 7/2012 | Su | H01L 29/861 257/409 |
| 2012/0228696 A1 | | 9/2012 | Carpenter et al. | |
| 2012/0256193 A1 | | 10/2012 | Hebert et al. | |
| 2012/0273878 A1 | | 11/2012 | Mallikarjunaswamy | |
| 2012/0274366 A1 | | 11/2012 | Briere | |
| 2012/0326287 A1 | | 12/2012 | Joshi et al. | |
| 2013/0049100 A1 | | 2/2013 | Su et al. | |
| 2016/0133534 A1 | | 5/2016 | Lopez et al. | |

* cited by examiner

POWER CONVERTER MONOLITHICALLY INTEGRATING TRANSISTORS, CARRIER, AND COMPONENTS

CROSS REFERENCE TO RELATED APPLICATION

This is a division of application Ser. No. 15/019,275, filed on Feb. 9, 2016, the entire disclosure of which is hereby incorporated by reference.

FIELD

Embodiments of the invention are related in general to the field of semiconductor devices and processes, and more specifically to the structure and fabrication method of a power converter integrating driver circuit.

DESCRIPTION OF RELATED ART

In today's technology, power converters with high current handling capabilities use discrete metal oxide semiconductor (MOS) field effect transistors (FETs). Among the popular families of power switching devices are the DC-DC power supply circuits, especially the category of Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET chip, also called the high side switch, is connected between the supply voltage V and the LC output filter, and the synchronous (sync) FET chip, also caned the low side switch, is connected between the LC output filter and ground potential.

The gates of the control FET and the sync FET are connected to a semiconductor chip including an integrated circuit (IC) acting as the driver of the converter, and the driver, in turn, is connected to a controller IC. Preferably, both ICs are integrated on a single chip, which is also connected to ground potential. The inductor of the output circuitry serves as the energy storage of the power supply circuit.

For many of today's power switching devices, the chips of the power MOSFETs and the chip of the driver and controller IC are assembled as individual components. Each chip is typically attached to a pad of a metallic leadframe; the pad is surrounded by leads as output terminals. Commonly, the leads are shaped without cantilever extensions and arranged in the manner of Quad Flat No-Lead (QFN) or Small Outline No-Lead (SON) devices. The electrical connections from the chips to the leads may be provided by bonding wires, or by metallic clips (which introduce less parasitic resistance and inductance than the wires). Each assembly is typically packaged in a plastic encapsulation, and the packaged components are employed as discrete building blocks for board assembly of power supply systems.

In recently introduced schemes, the control FET chip and the sync FET chip are assembled vertically on top of each other as a stack, with clips providing the connections to the switch node and the stack top. When both the low side (LS, sync) chip and the high side (HS, control) chip are assembled source-down, the typically larger (both physically and active area) LS chip is assembled onto the leadframe pad and the smaller (both physically and active area) HS chip has its source tied to the drain of the LS chip, forming the switch node of the converter; the drain of the HS chip is tied to the input supply $V_{IN}$. The leadframe pad is at ground potential and serves as a spreader of operationally generated heat.

In another recently introduced scheme for a converter, a monolithic silicon chip integrates a laterally diffused MOS transistor as the HS transistor with a source-down MOS transistor as the LS transistor. The chip uses the heavily p-doped starting silicon as source of the LS transistor and as substrate with terminal at ground potential; an n-doped well serves as isolation of the HS transistor from the source of the LS transistor. The terminals of $V_{IN}$ and the switch node are on the chip surface opposite the grounded substrate silicon.

SUMMARY

Applicants realized that a radically new approach was needed in order to significantly improve semiconductor transistor devices, including power blocks and power converters, with respect to reducing parasitic resistances and inductances, improving thermal performances and speed, enhancing operational reliability in moist and temperature-variable ambient, letting the package participate in the electrical device functions, and reducing manufacturing cost. The new approach had to be different from the conventional composite package, where semiconductor chips are assembled on a metallic carrier or stacked on top of each other and packaged in a plastic encapsulation, combines materials of widely different coefficients of thermal expansion, leading to a propensity for thermo-mechanical stresses, and requires a lengthy, time-consuming and costly fabrication flow. Applicants further realized that the market trend, especially for automotive and hand-held applications, requires ever more miniaturized semiconductor products.

Applicants solved substantial materials, functionality, and cost problems of a converter assembled from discrete components when they discovered a structure concept and manufacturing flow for converters, which avoid carriers and adopt and parallel the mass production and controlled processes of routine semiconductor wafer manufacturing. The new converter is based on using a monolithic silicon slab which integrated the transistors of a converter together with a carrier and thin film passive components so that the converter terminals are positioned and available for external contacts on only one surface of the monolith while the parallel opposite surface allows the attachment of additional components. The common positioning of the system converter terminals on one monolith surface is enabled by the use of through-silicon vias (TSVs).

For the converter transistors, the new concept eliminates the use of leadframes, bonding wires, clips, solder balls and plastic, ceramic and metallic housing. In addition, it creates space to place additional active and passive components. The fabrication processes use tried-and-true front-end techniques such as etching semiconductors, metals, and insulators, depositing layers of metals, insulators, and passivation, growing insulating layers, and patterning by photoresist technologies. These processes are flexible enough to form embedded passive components such as precision resistors and capacitors.

The resulting embodiments generally achieve smaller parasitic inductance and higher conversion efficiency than conventional solutions, and no longer suffer from mismatched coefficients of thermal expansion and thus allow the minimization of thermo-mechanical stresses. Thermal conductivity and thus electrical performance of the new devices is enhanced by attaching the monolith of the finished converter directly onto circuit boards.

DETAILED DESCRIPTION OF THE PREFERRED EMBODIMENTS

Figure 1:
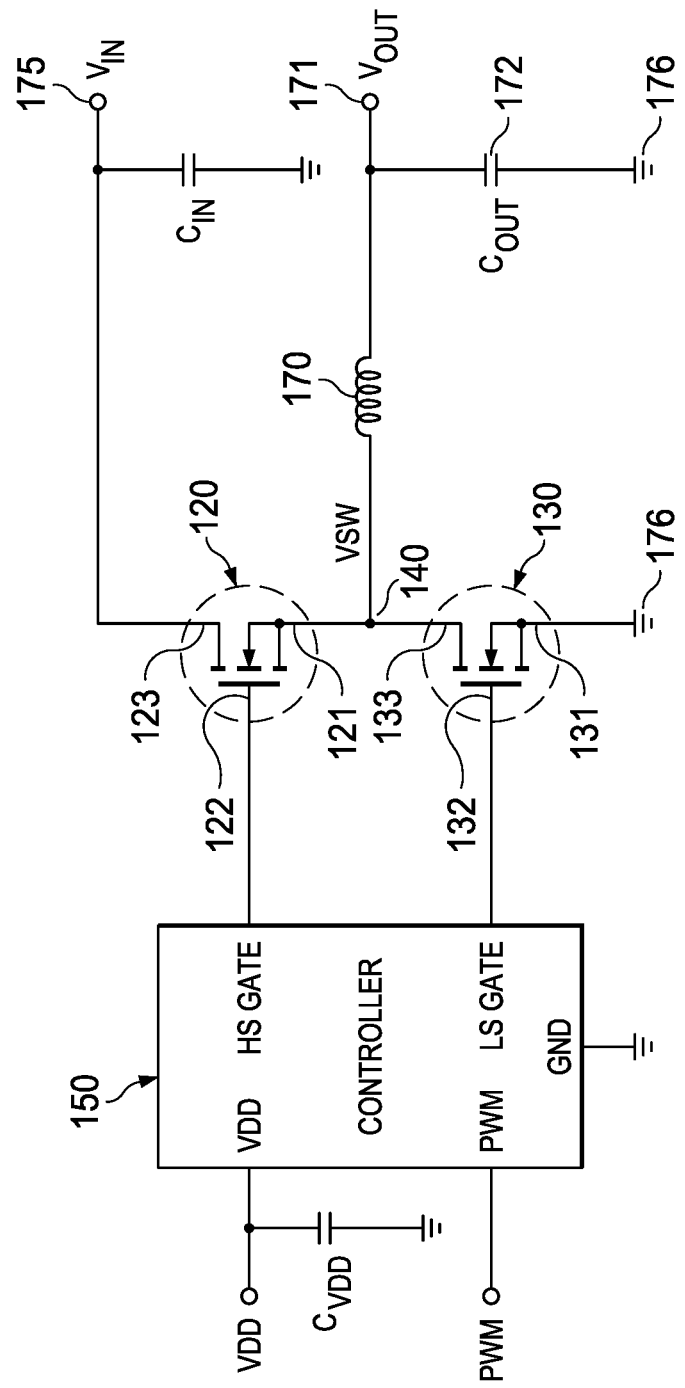
FIG. 1 depicts a circuit diagram of a power converter in accordance with various implementations.

FIG. 1 shows the circuit diagram of a DC-DC power converter, or synchronous buck converter. A low-side (LS) field effect transistor (FET) 130 is coupled in series with a high-side (HS) FET 120 so that HS FET 120 has its drain 123 connected to the input voltage $V_{IN}$ (175) and its source 121 coupled to the drain 133 of the LS FET 130. The source 131 of FET 130 is at ground potential 176. The gate 122 of FET 120 and the gate 132 of transistor 130 are operated by a gate driver 150, which in turn is regulated by a controller (combined on the chip of 150). The common connection between drain 133 and source 121 operates as the switch $V_{SW}$, designated 140. As mentioned, the HS FET is sometimes referred to as control FET, and the LS FET is sometimes referred to as sync FET.

In a DC-DC power supply circuit, common connection 140 is coupled to an inductor 170 serving as the energy storage of the power supply circuit; the inductor has to be large enough to reliably function for maintaining a constant output voltage $V_{OUT}$ (171). Output capacitor $C_{OUT}$ is designated 172. Additional components (such as input capacitor $C_{IN}$ and capacitor $C_{VDD}$) may be employed. A pulse width modulated signal is provided to the PWM input of controller 150. The PWM input signal is used by controller 150 to control the voltage level of the output voltage $V_{OUT}$ so that the input voltage can be converted to the desired different output voltage.

Figure 2:
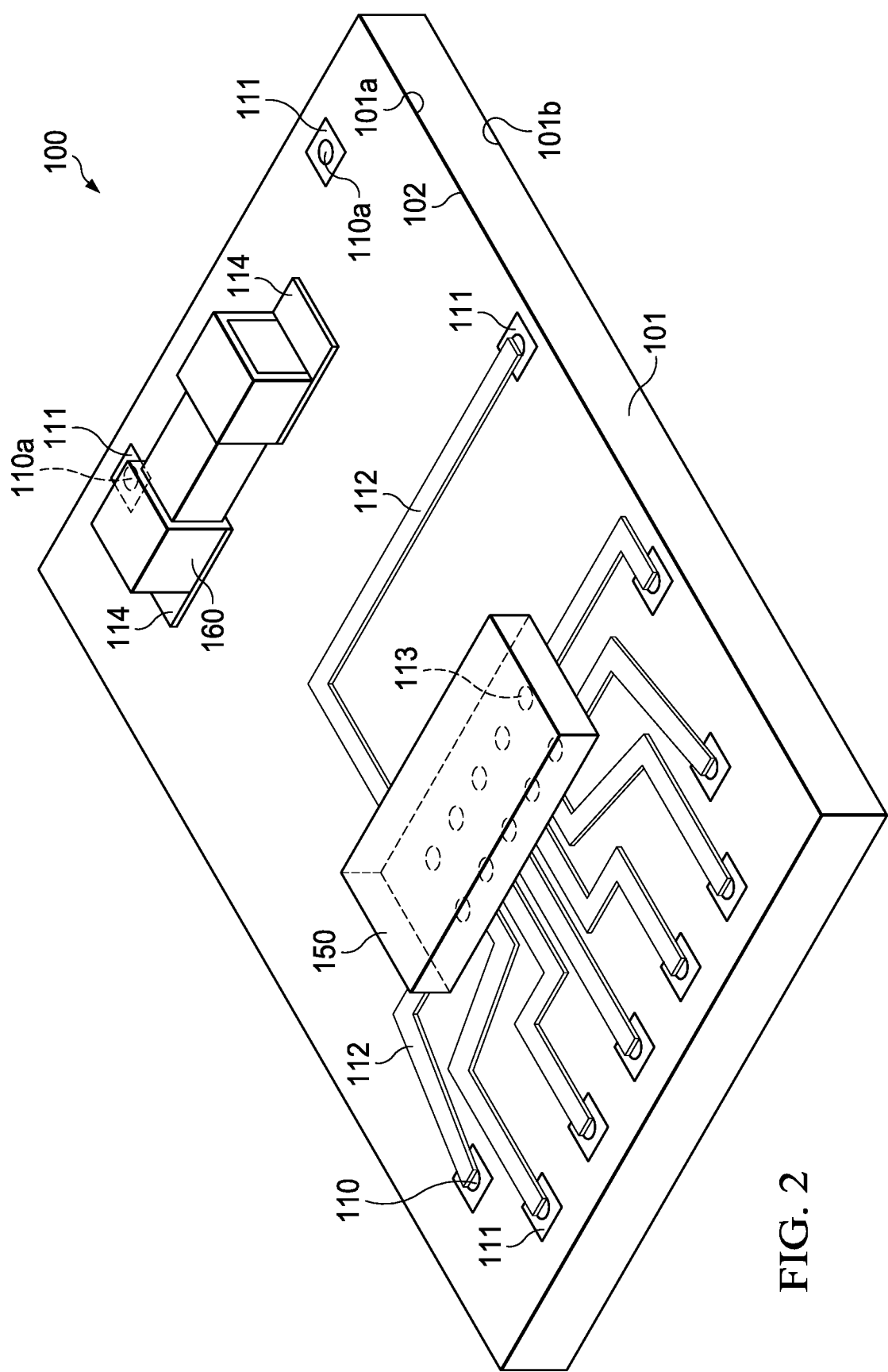
FIG. 2 shows a perspective view of the top surface of an embodiment of the invention comprising a semiconductor monolith integrating a pair of transistors interconnected as a power converter, a plurality of through-silicon vias connected by surface traces to terminals of an integrated circuit chip, and a passive component.
Figure 3:
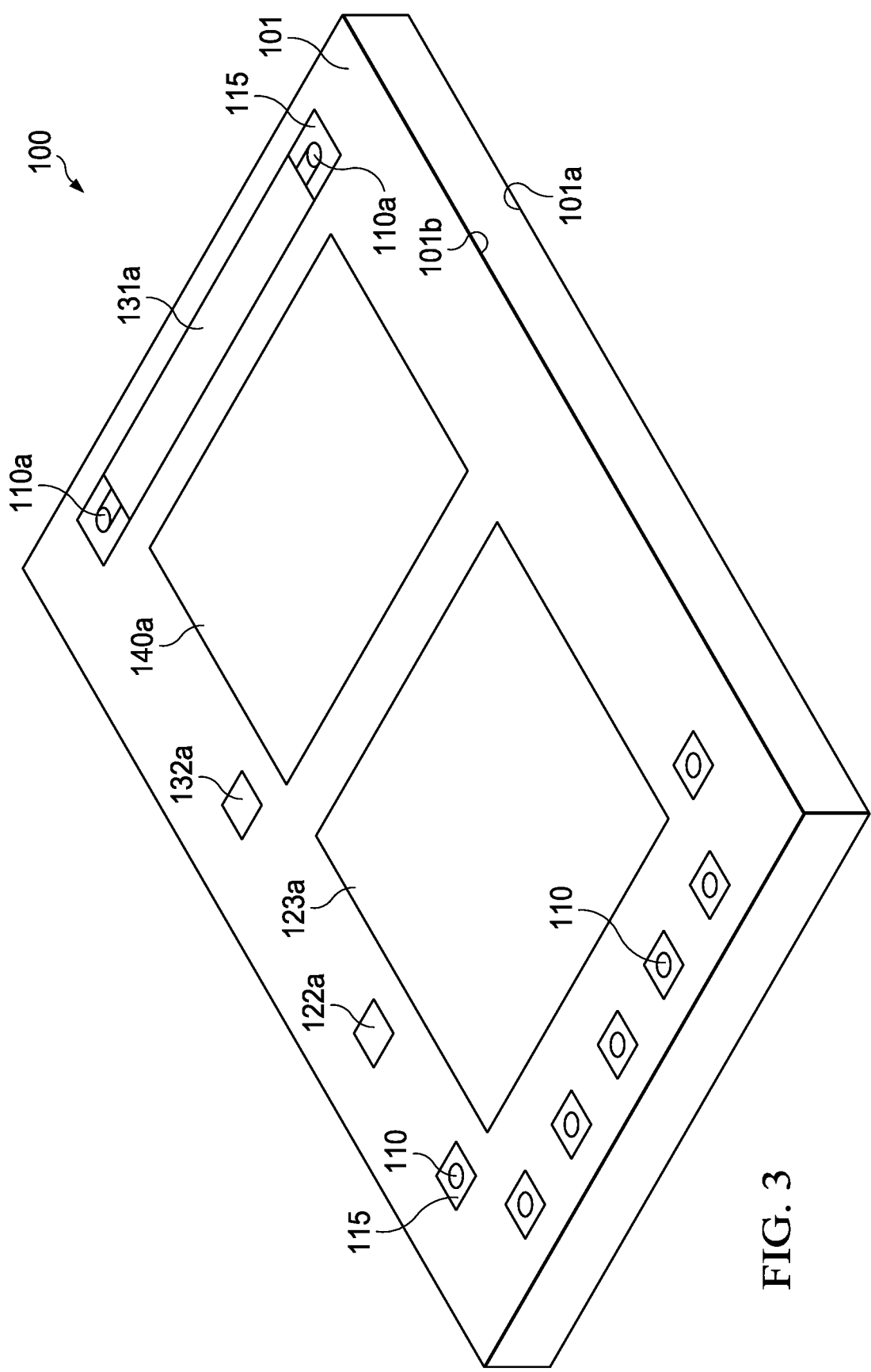
FIG. 3 illustrates a perspective view of the bottom surface of the embodiment in FIG. 2.

FIG. 2 illustrates a perspective top view of an embodiment of the invention generally designated 100, and FIG. 3 shows the perspective bottom view of embodiment 100. In FIG. 2, semiconductor chip 101 has a first surface 101a, a parallel second surface 101b, and a plurality of through-silicon vias (TSVs) 110 extending from the first to the second surface. There are several known technologies to create TSVs. In one such fabrication method, holes of about 25 μm diameter and extending from the first to the second surface are etched into silicon. The sidewalls of the holes are coated with a dielectric layer (<1 μm thick) made of silicon dioxide, silicon nitride, or another suitable insulator. Then a thin seed metal layer (such as tantalum nitride) is deposited, before the hole is filled with copper or another metal of high electrical conductivity.

Chip 101 is a monolithic slab of single-crystal semiconductor (preferably silicon), which includes a heavily doped substrate semiconductor and a lightly doped epitaxial semiconductor. Chip 101 embeds a high-side (HS) field effect transistor and a low side (LS) FET, which are monolithically integrated, together with the carrier, in the single chip of single-crystalline semiconductor and electrically interconnected as a DC-DC power converter. First surface 101a may be covered by a thin layer 102, which may be a backmetal coating such as conductive metal like titanium-copper-titanium or titanium-nickel-silver-titanium, deposited by sputtering or evaporation; or layer 102 may be an insulating layer such as silicon nitride or silicon carbide.

One set of TSVs, designated 110a, connects the heavily doped semiconductor substrate of chip 101 underlying surface 101a to the parallel opposite surface 101b. FIG. 2 indicates two TSVs 110a; however, there may be multiple TSVs to route the substrate to the surface 101b in order to form on surface 101b the ground contact of the converter.

First surface 101a further includes one or more sets of first metallic pads suitable as attachment sites for bonding wires, solder compounds, or conductive polymeric compounds. FIG. 2 shows a set of first pads 111, which serves as inlets of the TSVs 110, and another set of first pads 113, which serves as attachment sites for an integrated circuit (IC) chip; in particular, pads 113 are configured to operate as attachment sites for the IC terminals of the driver-and controller chip 150. In the example of FIG. 2, chip 150 is flip-attached using solder balls.

In the embodiment of FIG. 2, the IC terminals of the driver-and-controller chip 150 are conductively attached to the discrete pads 113, and pads 113 are connected by conductive surface traces 112 to respective first pads 111. Conductive surface traces 112 are isolated from the layer 102 of backmetal or otherwise conductive substrate surface 101a, by a suitable insulating material such as a sufficiently thick layer of dielectric compound like silicon dioxide.

Surface 101a further includes a plurality of conductive surface traces 112, which are isolated from the layer 102 of backmetal or otherwise conductive substrate by insulating material such as a sufficiently layer of dielectric or silicon dioxide. Traces 112 connect discrete metallic contact pads 113 to respective first pads 111, which are the inlets to the TSVs. Using the conductive vias, the terminals of the driver-and-control chip 150 are connected to second surface 101b of chip 101.

First surface 101a further includes a set of first metallic pads 114, referred to herein as fourth pads, which have a metallurgy suitable for attaching external electronic components by solder or a conductive adhesive. An example of an external electronic component is the capacitor 160 shown in FIG. 2.

FIG. 3 depicts a perspective view of the bottom surface 101b of chip 101. Included on surface 101b are metallic contact pads with a metallurgy suitable for attachment to a solder compound or a conductive adhesive compound. Among the pads are second metallic pads 115 as outlets of the TSVs 110, which originate on opposite parallel surface 101a, and pads 115 as outlets of the TSVs 110a.

Further among the pads are third metallic pads as the terminals of the converter formed by the interconnected embedded HS FET and LS FET. In actual devices, the HS and LS field effect transistors are realized as interdigitated source and drain structures and poly-silicon gate fingers. The gate contacts are gathered as gate busses. Collecting the finger structures and busses in to unified conductors enables the use of the singular terminals for the converter, as shown in FIG. 3. An example of the internal structure of interdigitated field effect transistors monolithically integrated into a power converter can be found in U.S. patent application Ser. No. 14/608,391, filed Jan. 29, 2015 (Wang, Baiocchi, and Lin, "Monolithically Integrated Transistors for a Buck Converter Using Source Down MOSFET").

The third pads of FIG. 3 include pad 123a of the drain 123 of the HS FET, which is to be tied to the input voltage $V_{IN}$ 175. Third pads further include pad 140a of the common connection $V_{SW}$ (switch node) 140, which is tied to the drain 133 of the LS FET as well as the source 121 of the HS FET. In addition, third pads include pad 131a of the source 131 of the LS FET, which is to be tied to ground 176. As stated above, pad 131a tied to ground potential is connected by multiple TSVs 110a to the opposite chip surface comprising heavily doped semiconductor substrate material.

Further included in the third pads are pad 122a of the gate bus for HS FET gate 122, and pad 132a of the gate bus for LS FET gate 132. As stated, pads 122a and 132a are the terminals of the gate busses.

It is a technical advantage that all terminals of the converter built by integrating a high-side FET and a low-side FET monolithically into a single silicon chip can be brought to a single surface with the help of TSVs, since in a board assembly process, these terminals can be attached to the board in a single step by using solder or a conductive adhesive. As a consequence, this simplified process not only saves time and cost, but also improves the thermal performance and speed of the converter by enhanced dissipation of operationally created heat.

Figure 4:
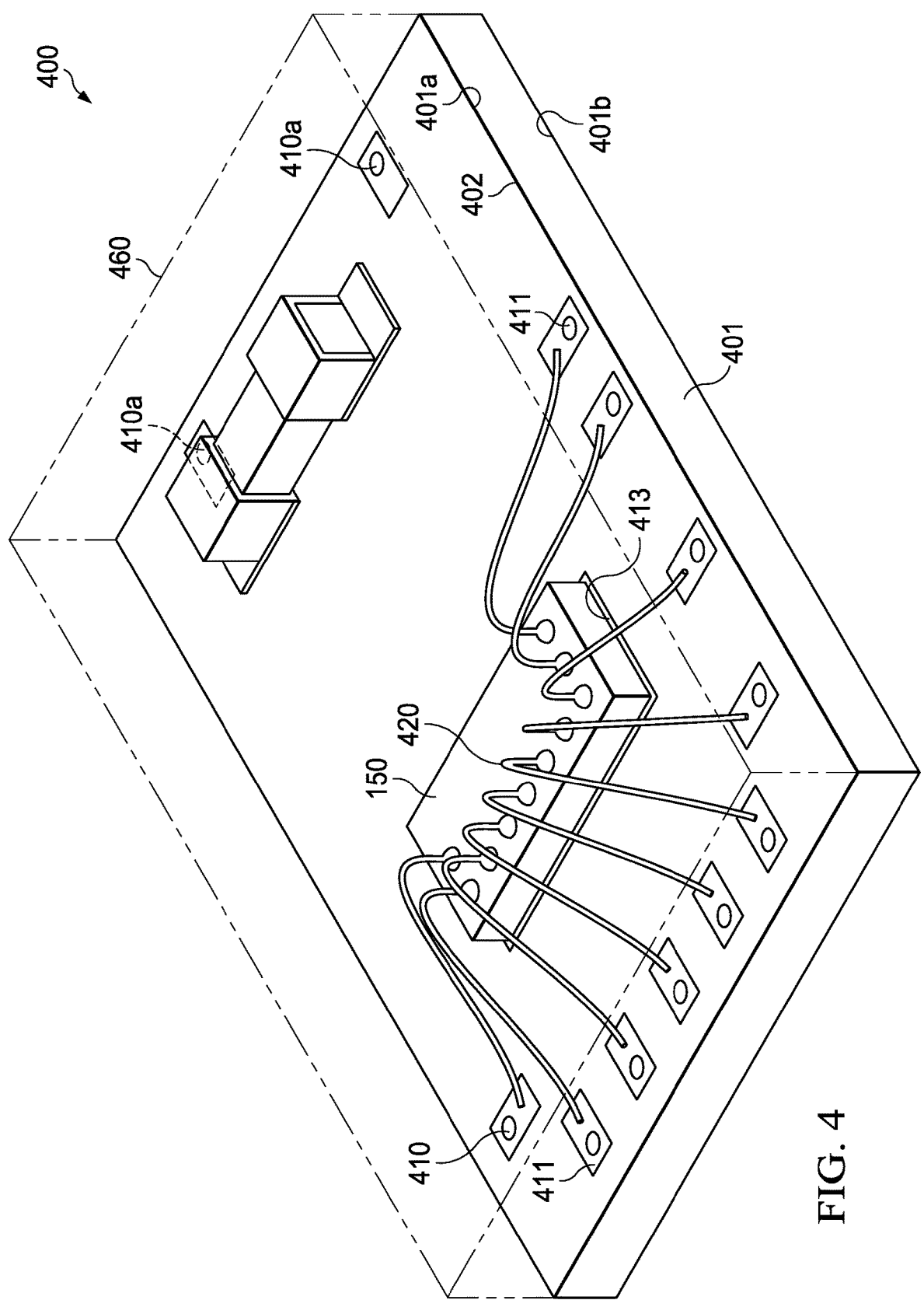
FIG. 4 depicts a top perspective view of another embodiment of the invention.

FIG. 4 shows the top view of another embodiment of the invention generally designated 400. Semiconductor chip 401 has a first surface 401a, a parallel second surface 401b, and a plurality of TSVs 410 extending from the first to the second surface. The through-silicon vias have a diameter of about 25 µm, are metal-filled yet insulated from the semiconductor by a thin dielectric layer.

Chip 401 is a monolithic slab of single-crystal semiconductor (preferably silicon), which includes a heavily doped substrate semiconductor and a lightly doped epitaxial semiconductor. Chip 401 embeds a high-side (HS) field effect transistor and a low side (LS) FET, which are monolithically integrated in the single chip and interconnected as a DC-DC power converter. First surface 401a may be covered by a thin layer 402, which may be a backmetal coating such as conductive metal like titanium-copper-titanium or titanium-nickel-silver-titanium, deposited by sputtering or evaporation; or layer 402 may be an insulating layer such as silicon nitride or silicon carbide. In addition to TSVs 410, there are other TSVs, designated 410a, which are designed to connect the heavily doped semiconductor substrate of chip 401 directly under surface 401a to the parallel opposite surface 401b.

First surface 401a further includes first metallic pads suitable as attachment sites for bonding wires. FIG. 4 shows first pads 411, which serves as inlets of the TSVs 410. Pads 411 have a metallurgy suitable for forming reliable wire stitch bonds. Another pad 413 on surface 401a is suitable for attaching a semiconductor chip, preferably by conductive adhesive. In the embodiment of FIG. 4, the IC terminals of the driver-and-controller chip 150 are designed for wire ball bonding. As FIG. 4 shows, wire ball bonds 420 connect the chip terminals to the pads 411 as inlets to the TSVs 410.

For protection of the bonding wires, the wires and the first surface 401a are encapsulated in a packaging compound 470. The preferred encapsulation compound is an epoxy-based formulation and the preferred packaging technology is a molding process.

First surface 401a further includes a set of metallic pads 414, which have a metallurgy suitable for attaching external electronic components by solder or a conductive adhesive. An example of an external electronic component is the capacitor 460 shown in FIG. 4. On the other hand, electronic components may also be integrated into the circuitry embedded in the monolith 401 as thin film components; an example is a thin film capacitor.

It is a technical advantage that, in contrast to existing structures and methodologies, the monolithically integrated converter of FIGS. 2 and 3 does not have the physical package interconnects and intrinsic distances, which are prevalent in converters fabricated by existing technology. Clips and bonding wires and their associated parasitic resistances and inductances are avoided; other parasitic interconnects are at least reduced. Leadframes and molding compounds together with their time- and cost-intensive assembly and packaging processes are not needed.

The elimination of conventional converter parts without sacrificing their function also reduces the size of the converter and thus the space it consumes. As an example, size reduction enables the circuit loops between $V_{IN}$ and ground to be tighter, reducing the disturbing ringing phenomenon. In addition, the size reduction improves thermal dissipation from the converter to the board or to heat sinks. The improved thermal performance together with the reduced electrical parasitics increase converter performance, especially speed. Needless to state that the simplified assembly and packaging processes of the monolithically integrated converter reduce the high conventional converter manufacturing costs.

Figure 5:
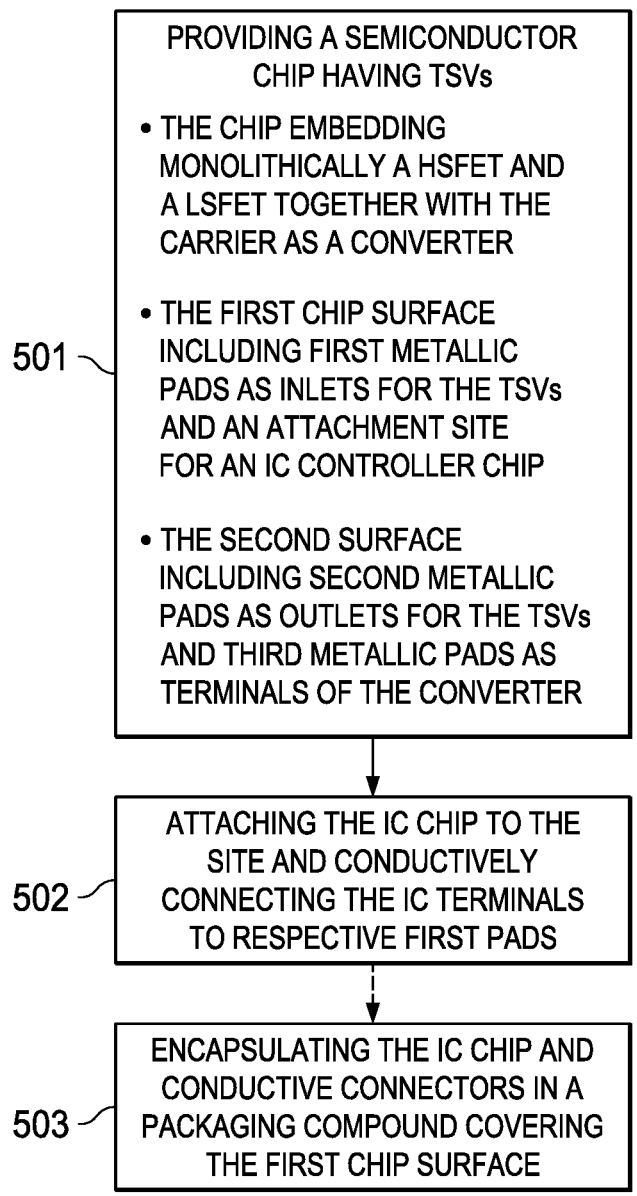
FIG. 5 shows a diagram of the process flow of fabricating a converter monolithically integrating transistors, carrier and components.

The method described above of fabricating a converter, which monolithically integrates transistors, carrier, and components, is summarized in the diagram of the process flow of FIG. 5. In process 501, a slab-like semiconductor chip is provided, which has a first and a parallel second surface, and a plurality of TSVs extending from the first to the second surface. The slab-like chip is embedding monolithically a high-side (HS) field-effect transistor (FET) and a low side (LS) FET together with their carrier; the transistors are interconnected as a power converter. The first surface of the slab-like chip includes first metallic pads as inlets of the TSVs, and further an attachment site for an integrated circuit (IC) driver-and-controller chip. The second surface of the slab-like chip includes second metallic pads as outlets of the TSVs, and further third metallic pads as terminals of the converter, which is formed by the HS FET and LS FET.

In process 502, the IC driver-and-controller chip is attached to the site on the first surface of the slab-like chip. When the IC chip is structured so that the IC terminals include solder balls, the IC chip is flipped and the solder balls attached to conductive traces leading to respective first metallic pads as inlets to the TSVs.

On the other hand, when the IC chip is structured so that the IC terminals require bonding wire connections, the IC chip is attached to the site on the first surface of the slab-like chip and then wires are spanned to respective first metallic pads as inlets to the TSVs. For protection of the wires, process 503 is needed to encapsulate the wires together with the IC chip in a packaging compound, which covers the first surface of the slab-like chip.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention applies not only to field effect transistors, but also to other suitable power transistors, to bipolar transistors, insulated gate transistors, thyristors, and others.

As another example, the above considerations for structure and fabrication method of power converters apply to regulators, multi-output power converters, applications with sensing terminals, applications with Kelvin terminals, and others.

It is therefore intended that the appended claims encompass any such modifications or embodiments.

We claim:

1. A method for fabricating a power converter comprising:
providing a semiconductor chip having a first and a parallel second surface, and through-silicon vias (TSVs) extending from the first to the second surface, the chip including a heavily-doped substrate semiconductor and a lightly doped epitaxial semiconductor in direct contact with the heavily-doped substrate, the chip embedding monolithically a high-side (HS) field-effect transistor (FET) and a low side (LS) FET together with the carrier interconnected as a power converter, the first surface including first metallic pads as inlets of the TSVs and an attachment site for an integrated circuit (IC) driver- and controller chip, and the second surface including second metallic pads as outlets of the TSVs and third metallic pads as terminals of the converter formed by the HS FET and LS FET; and
attaching the IC chip to the site on the first surface while conductively connecting the IC terminals to respective first pads.

2. The method of claim 1 wherein the process of attaching comprises the process of conductively attaching the terminals of the IC are to discrete metallic pads on the first surface while the pads are connected by conductive surface traces to respective first pads.

3. The method of claim 1 wherein the process of attaching comprises the process of wire bonding the terminals of the IC to respective first pads.

4. The method of claim 3 further including the process of encapsulating the wires together with the IC chip in a packaging compound covering the first surface.

5. The method of claim 1 wherein the third pads include a pad each for the inlet of the HS FET, the gate of the HS FET, the outlet of the LS FET, the gate of the LS FET, and for the common switch-node of the HS FET and LS FET.

6. The method of claim 1 further including electronic components as thin film devices embedded in the semiconductor chip and connected to the FETs.

7. The method of claim 1 wherein the semiconductor chip further includes fourth metallic pads on the first surface for attaching external electronic components.

8. The method of claim 1 further including the process of attaching an external component to respective fourth pads.

9. The method of claim 7 wherein one of the external electronic components is a capacitor.

10. A method for fabricating a power converter comprising:
providing a semiconductor chip having a first and a parallel second surface, and through-silicon vias (TSVs) extending from the first to the second surface, the chip including a heavily-doped substrate semiconductor and a lightly doped epitaxial semiconductor in direct contact with the heavily-doped substrate, the chip embedding monolithically a high-side (HS) field-effect transistor (FET) and a low side (LS) FET together with the carrier interconnected as a power converter, the first surface including first metallic pads as inlets of the TSVs and an attachment site for an integrated circuit (IC) driver- and controller chip, and the second surface including second metallic pads as outlets of the TSVs and third metallic pads as terminals of the converter formed by the HS FET and LS FET;
attaching the IC chip to the site on the first surface while conductively connecting the IC terminals to respective first pads, the process of attaching comprises the process of wire bonding the terminals of the IC to respective first pads; and
encapsulating the wires together with the IC chip in a packaging compound covering the first surface.

11. The method of claim 10 wherein the process of attaching comprises the process of conductively attaching the terminals of the IC are to discrete metallic pads on the first surface while the pads are connected by conductive surface traces to respective first pads.

12. The method of claim 10 wherein the third pads include a pad each for the inlet of the HS FET, the gate of the HS FET, the outlet of the LS FET, the gate of the LS FET, and for the common switch-node of the HS FET and LS FET.

13. The method of claim 10 further including electronic components as thin film devices embedded in the semiconductor chip and connected to the FETs.

14. The method of claim 10 wherein the semiconductor chip further includes fourth metallic pads on the first surface for attaching external electronic components.

15. The method of claim 10 further including the process of attaching an external component to respective fourth pads.

16. The method of claim 14 wherein one of the external electronic components is a capacitor.

* * * * *